US011798979B2

(12) United States Patent
Stewart et al.

(10) Patent No.: US 11,798,979 B2
(45) Date of Patent: Oct. 24, 2023

(54) INTEGRATED CAPACITOR WITH SIDEWALL HAVING REDUCED ROUGHNESS

(71) Applicant: TEXAS INSTRUMENTS INCORPORATED, Dallas, TX (US)

(72) Inventors: Elizabeth Costner Stewart, Dallas, TX (US); Jeffrey A. West, Dallas, TX (US); Thomas D. Bonifield, Dallas, TX (US); Joseph Andre Gallegos, Dallas, TX (US); Jay Sung Chun, Plano, TX (US); Zhiyi Yu, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 202 days.

(21) Appl. No.: 17/156,793

(22) Filed: Jan. 25, 2021

(65) Prior Publication Data

US 2021/0143249 A1    May 13, 2021

Related U.S. Application Data

(62) Division of application No. 15/348,580, filed on Nov. 10, 2016, now Pat. No. 10,978,548.

(51) Int. Cl.
*H01L 49/02* (2006.01)
*H01L 21/02* (2006.01)
*H01L 21/768* (2006.01)
*H01L 21/311* (2006.01)

(52) U.S. Cl.
CPC ........ *H01L 28/40* (2013.01); *H01L 21/02211* (2013.01); *H01L 21/02214* (2013.01); *H01L 21/02216* (2013.01); *H01L 21/02263* (2013.01); *H01L 21/02274* (2013.01); *H01L 21/31116* (2013.01); *H01L 21/7682* (2013.01); *H01L 21/76822* (2013.01); *H01L 21/76825* (2013.01); *H01L 21/76837* (2013.01)

(58) Field of Classification Search
CPC ............... H01L 27/124; H01L 29/7869; H01L 23/49894; H01L 23/5223; H01L 28/40; H01L 28/55–57; H01L 21/76837; H01L 21/7682; H01L 21/76822; H01L 21/76825
See application file for complete search history.

(56) References Cited

U.S. PATENT DOCUMENTS 5,573,979 A * 11/1996 Tsu .................... H01L 21/32136
                                                257/E21.311
6,037,220 A   3/2000 Chien et al.
6,117,727 A   9/2000 King
6,180,518 B1  1/2001 Layadi et al.
6,777,776 B2  8/2004 Hieda
6,815,226 B2  11/2004 Lee et al.

(Continued)

*Primary Examiner* — Younes Boulghassoul
*Assistant Examiner* — Quinton A Brasfield
(74) *Attorney, Agent, or Firm* — Andrew R. Ralston; Frank D. Cimino

(57) ABSTRACT

An integrated capacitor on a semiconductor surface on a substrate includes a capacitor dielectric layer including at least one silicon compound material layer on a bottom plate. The capacitor dielectric layer includes a pitted sloped dielectric sidewall. Each of the pits is at least partially filled by one of a plurality of noncontiguous dielectric portions. A conformal dielectric layer may be formed over the noncontiguous dielectric portions. A top metal layer provides a top plate of the capacitor.

23 Claims, 8 Drawing Sheets

(56) References Cited

U.S. PATENT DOCUMENTS

| | | | |
|---|---|---|---|
| 7,064,061 B2* | 6/2006 | Passemard | H01L 21/76831 438/738 |
| 7,652,349 B2* | 1/2010 | Kuwajima | H01L 28/40 257/532 |
| 8,274,779 B2* | 9/2012 | Yoon | H01G 4/1209 361/313 |
| 9,299,697 B2 | 3/2016 | West et al. | |
| 2005/0117382 A1 | 6/2005 | Kim et al. | |
| 2005/0266698 A1* | 12/2005 | Cooney | H01L 21/76802 257/E21.252 |
| 2007/0201182 A1 | 8/2007 | Nakayama | |
| 2010/0221916 A1 | 9/2010 | Rana et al. | |
| 2012/0098045 A1* | 4/2012 | Tian | H01L 28/40 257/532 |
| 2013/0328168 A1* | 12/2013 | Malhotra | H01L 28/56 257/532 |
| 2016/0133690 A1 | 5/2016 | West et al. | |

* cited by examiner

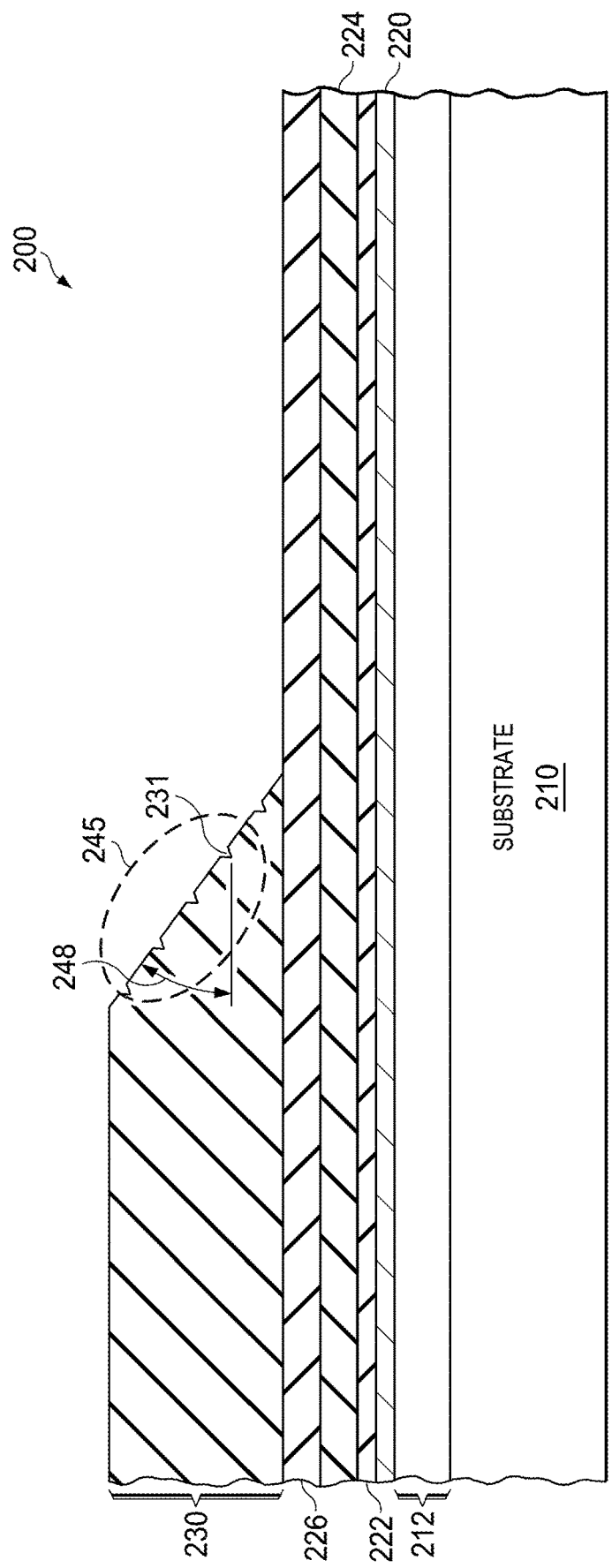

INTEGRATED CAPACITOR WITH SIDEWALL HAVING REDUCED ROUGHNESS

CROSS-REFERENCE TO RELATED APPLICATIONS

This application has subject matter related to U.S. Pat. No. 9,525,021.

FIELD

This application relates in general to electronic circuitry, and in particular to methods of forming integrated high voltage capacitors and integrated circuits therefrom.

BACKGROUND

In modern industrial equipment, computer controllers are being utilized in greater numbers of applications. The need for electrical isolation between the low voltage of controllers and the high voltage of motors or equipment is growing. Depending on the equipment being controlled, there are various known approaches used to isolate the systems electrically but that still allow electrical coupling. Isolation provides an AC path for signals or power between two circuits but eliminates direct connections. This is important where ground potential differences exist between nodes.

Isolation is used to break the direct connection paths between the signal domains and to break the common ground loop, because noise can be transmitted through the ground loop that would otherwise interfere with the proper operation of the circuits. Known isolation approaches can include using a transformer to couple circuits magnetically, an RF signal to couple through a radiated energy, an opto-isolator using light energy, or using a capacitor between the two circuits that couples the circuits together using an electric field. Other isolation needs include integration of analog and digital circuitry onto a single packaged integrated circuit with separate power domains, for example.

Although opto-isolators are a suitable solution for low speed communication applications, in other applications where isolation is needed and an opto-isolator is not appropriate, a capacitor is generally used. Capacitors provided on a circuit board or as part of the package for integrated circuits have been used for isolation, such as a hybrid package for integrated circuits that includes two silicon integrated circuit devices positioned within a package and planar discrete capacitors formed on a ceramic substrate also within the package for isolation between the two silicon circuits. However as integration of circuits onto silicon continues to advance, isolators that can be formed on the semiconductor substrate with other circuitry, e.g., integrated capacitor isolators, are used and desired. To gain increased capacitance values for use with higher voltages, the capacitors used in known approaches can be coupled serially, however, this approach requires additional silicon area. Integrated capacitors of values capable for high voltage isolation are therefore desired. These capacitors could be used serially to gain still higher capacitor values, or the isolation capacitors could be used to form discrete components as well as being used in integrated circuits with additional circuitry.

Within this application and as currently described in the power circuits industry, low voltage is considered as below 50 volts, high voltage is defined as a voltage greater than 50 volts and less than 5,000 volts. Extra-high voltage is a voltage greater than 5,000 volts to less than about 20,000 volts. Integrated high voltage capacitors disclosed herein are directed at high voltage and extra-high voltage applications.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize with the trend for miniaturization, control interfaces utilizing high voltage integrated capacitors for isolation are needed. Integrated capacitors provide the smallest area solution for isolation and power circuit applications. However, in known solutions, to create an integrated capacitor in the extra-high voltage range, greater than 5,000 volts peak for example, the large capacitance needed has been formed by coupling two or more lower voltage capacitors in series. Increased capacitor values are therefore desired to further reduce the semiconductor (e.g., silicon) area needed to achieve a particular isolation circuit solution.

A recognized challenge to processing high voltage integrated capacitors is eliminating the parasitic breakdown to floating residual metal particles that can be present in pores within the sloped dielectric sidewall portion of the completed integrated capacitor. One method of forming an integrated capacitor involves etching an approximately >8 µm thick silicon compound material layer (e.g., a silicon oxide containing film stack) that is on a bottom electrically conductive plate to achieve a sidewall having a sloped dielectric sidewall portion. A known oxide etch recipe leaves the resulting silicon compound material layers along its sloped sidewall portion rough and pitted. The roughness and pits in the sloped sidewall portion can trap metal after metal etch used for defining the top plate metal intended to clear all metal from the sloped sidewall portion. Trapped metal in the sloped sidewall portion can cause reliability issues due to premature (lower relative to the needed HV level) parasitic breakdown.

Two example depositions and etch flows are disclosed for filling the pores in the sloped sidewall portion to reduce the roughness before the top plate metal processing. High density plasma (HDP) deposition followed by an etch can be used to reduce the roughness and fill in the sidewall pits. A sub-atmospheric chemical vapor deposition (SACVD) followed by an etch can also be used to deposit a dielectric layer that fills in the sidewall pits. The etch in either case is typically a blanket etch to render the deposited layer a discontinuous layer that fills within the sidewall pits.

Disclosed dielectric sidewall roughness reduction solutions do need to include any modification to the sidewall dielectric etch recipe, and thus do not change the silicon compound material layer sidewall slope angle. The disclosed processing to reduce roughness, such as SACVD or HDP followed by a blanket etch, can be implemented in a current process flow, and does not need to introduce any new film in the dielectric stack, or as noted above does not impact the sidewall slope angle.

BRIEF DESCRIPTION OF THE DRAWINGS

Reference will now be made to the accompanying drawings, which are not necessarily drawn to scale, wherein:

FIG. 2A depicts a cross-sectional view of a portion of a high voltage or an extra-high voltage capacitor utilizing the mesa formation arrangement after an etch step to form a sloped edge transition region.

DETAILED DESCRIPTION

Figure 1:
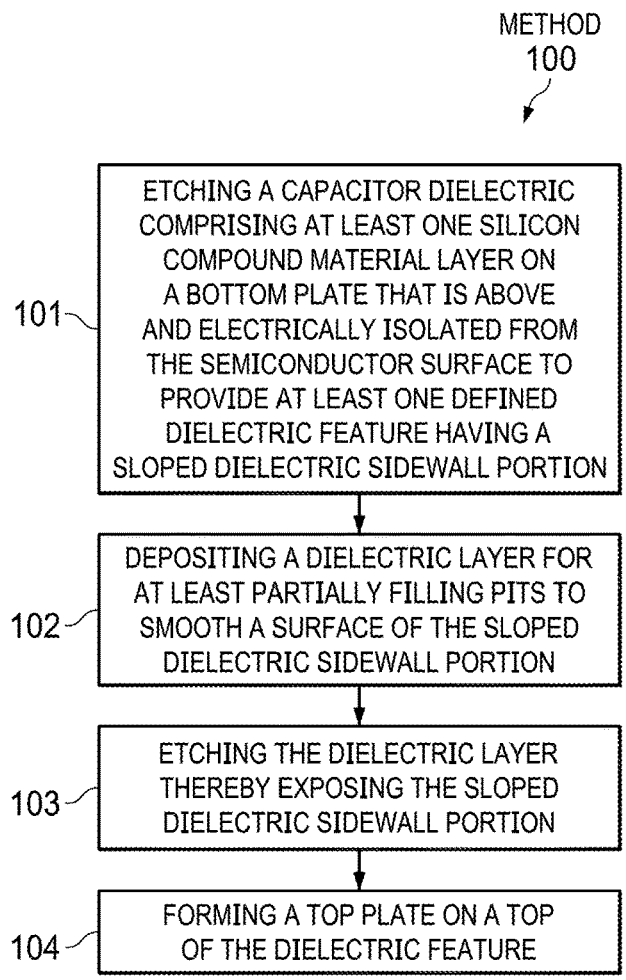
FIG. 1 is a flow chart that shows steps in an example method for forming an integrated capacitor with its dielectric sidewall portion having reduced roughness, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include methods and apparatus to fabricate a high voltage or extra-high voltage integrated capacitor on a substrate (e.g., a wafer) within a semiconductor fabrication process flow. The fabrication techniques utilize a patterned thick dielectric layer generally comprising a plurality of layers, referred to herein as a "mesa stack", formed in the upper portions of a semiconductor wafer. The mesa stack is used to increase the distance between the capacitor top and bottom plates and thus the capacitor's voltage rating. Because the thick dielectric layer is positioned vertically above the remainder of the semiconductor surface of the substrate and has a flat upper surface, it appears as a mesa shape.

Disclosed integrated capacitors also include dielectric sidewall roughness reduction. In the fabrication of disclosed integrated capacitors, only standard semiconductor processes used in current production are needed and an advantageous aspect is the ability to integrate the high voltage capacitor within standard wafer production processes along with forming other IC components including transistors. Throughout this detailed description, well known processes or operations are identified but not shown in full detail to prevent from obscuring the aspects of the disclosed subject matter.

Throughout this detailed description some acronyms familiar to the semiconductor industry are used. Some of those are IC (integrated circuit), CMP (Chemical Mechanical Polish), CVD (chemical vapor deposition), PECVD (Plasma Enhanced CVD), PO (Protective Overcoat) and TEOS layer (a silicon oxide formed from a tetraethylorthosilicate source).

FIG. 1 is a flow chart that shows steps in an example method 100 for forming an integrated capacitor on a semiconductor surface on a substrate with its sloped dielectric sidewall having reduced roughness, according to an example embodiment. Step 101 comprises etching a capacitor dielectric comprising at least one silicon compound material layer (generally a mesa stack comprising a plurality of layers) on a bottom plate that is above and electrically isolated from the semiconductor surface to provide at least one defined dielectric feature having a sloped dielectric sidewall portion. FIG. 2A depicts a cross-sectional view 200 of a portion of a high voltage or an extra-high voltage capacitor utilizing a mesa stack (230/226/224) arrangement on a metal barrier layer (or migration barrier layer) 222 on a bottom capacitor plate (bottom plate) 220 formed after step 101. The mesa stack provides a sloped edge transition region 245 including the sidewalls of the capacitor's primary dielectric layer described herein only for example as a 'primary mesa TEOS layer' that is shown as 230 in FIG. 2A. The sloped edge transition region 245 may include pits 231 following the etch process.

The approximate desired angle 248 in the sloped edge transition region 245 can be from approximately 10 degrees to approximately 40 degrees measured from the horizontal plane. The purpose of this gradually sloped dielectric sidewall is to allow subsequent wafer level processing to occur successfully, such as a blanket deposited metal on the wafer for the top plate of the capacitor that can be later etched off the dielectric sidewall without leaving residual metal which tends to happen if the wall were instead largely vertical, and to enable spinning photoresist without streaks or spin spikes.

The silicon compound material layer(s) or mesa stack (230/226/224) is generally at least 4 μm thick, such as 6 μm to 12 μm thick, and typically comprises 2 or more different layers. The silicon compound material layer can be primarily (more than 50% of the thickness) silicon oxide, such as provided by the primary mesa TEOS layer 230.

The etching can comprise a dry etch on a photoresist patterned wafer, such as using a plasma etch with $C_4F_8$ and $O_2$ gases in the case the silicon compound material layer comprises silicon oxide or is primarily (by thickness) silicon oxide. The resist patterned wafer is etched such that large amounts (typically 50% to 90% of the area) of the silicon compound material layer are etched away from the wafer surface, in the case of an array of disclosed capacitors leaving islands/mesas of the silicon compound material layer on the bottom capacitor plate (bottom plate) 220 remaining where there was photoresist.

The mesa stack can be etched using a timed etch to provide the sidewall structure shown in FIG. 2A by etching entirely through the primary mesa TEOS layer 230 and stopping on the ESL 226. Alternatively, with the ESL 226 excluded in the mesa stack so that the primary mesa TEOS layer 230 is directly on the initial mesa oxide layer 224, a timed etch can be used to etch entirely through the primary mesa TEOS layer 230 and partially through the initial mesa oxide layer 224, for example to leave about 0.5 µm to 1 µm of mesa oxide layer 224 remaining from an initial mesa oxide layer 224 thickness of 2 µm or more. Upon photoresist strip, there is at least one defined thick dielectric feature having a sloped dielectric sidewall portion on the bottom plate 220.

As noted above the integrated capacitor shown in FIG. 2A includes a metal barrier layer 222 between the bottom plate 220 and the initial mesa oxide layer 224. In one example arrangement the metal barrier layer 222 can comprise silicon nitride formed using known deposition processes such as CVD or by a HDP process. Alternatives for the metal barrier layer 222 include a SiCN layer and other dielectrics commonly used as barrier layers.

The initial mesa oxide layer 224 may be referred to as the "sub-ESL" layer, as it lies beneath the ESL 226. In an example arrangement the initial mesa oxide layer 224 can be approximately 0.25 µm to 1 µm thick and can be applied by known oxide deposition processes. ESL 226 follows and can be formed approximately 0.25 µm to 0.45 µm thick by known processes. Materials for the ESL 226 are chosen so that selective etch chemistry of the overlying layer (to be described next) can be used. ESL 226 can be formed of silicon oxynitride (SiON), for example, or another dielectric that differs from the mesa dielectric layer to be formed next, so that a selective etch of silicon dioxide mesa material (described below) can be performed.

At this point in the fabrication the primary mesa TEOS layer 230 is deposited on the wafer using known processes, such as CVD or PECVD. In this non-limiting example arrangement, a simple and cost effective method is to deposit a single thick layer of TEOS-derived silicon oxide. The thickness of the primary mesa TEOS layer 230 can be determined by the evaluating the desired breakdown voltage Vbr required, and the thickness of the primary mesa TEOS layer 230 can be limited by the amount of temporary wafer bow or wafer warpage that can be tolerated in the semiconductor fabrication process.

For tuning the breakdown voltage, the primary mesa TEOS layer 230 may be applied in a range of approximately 6 µm to 20 µm thick with thicker layers providing the highest breakdown voltage but also carrying the highest risk for wafer warpage. However forming a single deposition layer of the required thickness in a single processing step, while practical, can impose difficulties on the processing equipment. For example, if a single TEOS deposition of more than 8 µms is performed in one deposition step, a layer of silicon oxide of the same thickness deposits on the walls of the processing chamber. This wall oxide has to be removed from the process chamber using a plasma etch and clean process, which can be quite lengthy when the wall oxide is of this thickness, affecting tool downtime and throughput rate in the semiconductor processing facility or tool.

The primary mesa TEOS layer 230 can be, in some alternative arrangements, applied in thinner layers in a sequence of deposition steps. In another alternative arrangement that is also described below, the layers can be applied in successive layers of compressed and tensile stressor oxide layers formed in multiple deposition steps to help mitigate the amount of wafer warpage. Further, the primary mesa TEOS layer 230 can be formed using a process of successive, thinner oxide deposition steps with cooling steps between the oxide depositions, improving wafer bow effects and reducing stress on the wafer. These alternative arrangements are also further described in detail below. The thickness of the total dielectric required for a particular capacitance value influences the amount of wafer bow or warpage that will occur and impacts the decision about whether to use single or multiple dielectric layers in creating the primary mesa TEOS layer 230.

The versatility of the integrated capacitor with mesa structure disclosed herein allows the capacitor structure to be built on different semiconductor fabrication processes containing as few as two levels of metal and as many as eight or more levels of metal. The bottom plate 220 can generally be formed within any of the metal levels fabricated during the semiconductor processing of the layers 212. The metal layer for the bottom plate 220 can be, for example, aluminum or copper or alloys thereof, the metal being the one used in the particular semiconductor fabrication process. Single and dual-damascene copper or copper alloy materials can be used to form the metal layer for the bottom plate 220.

Figure 2B:
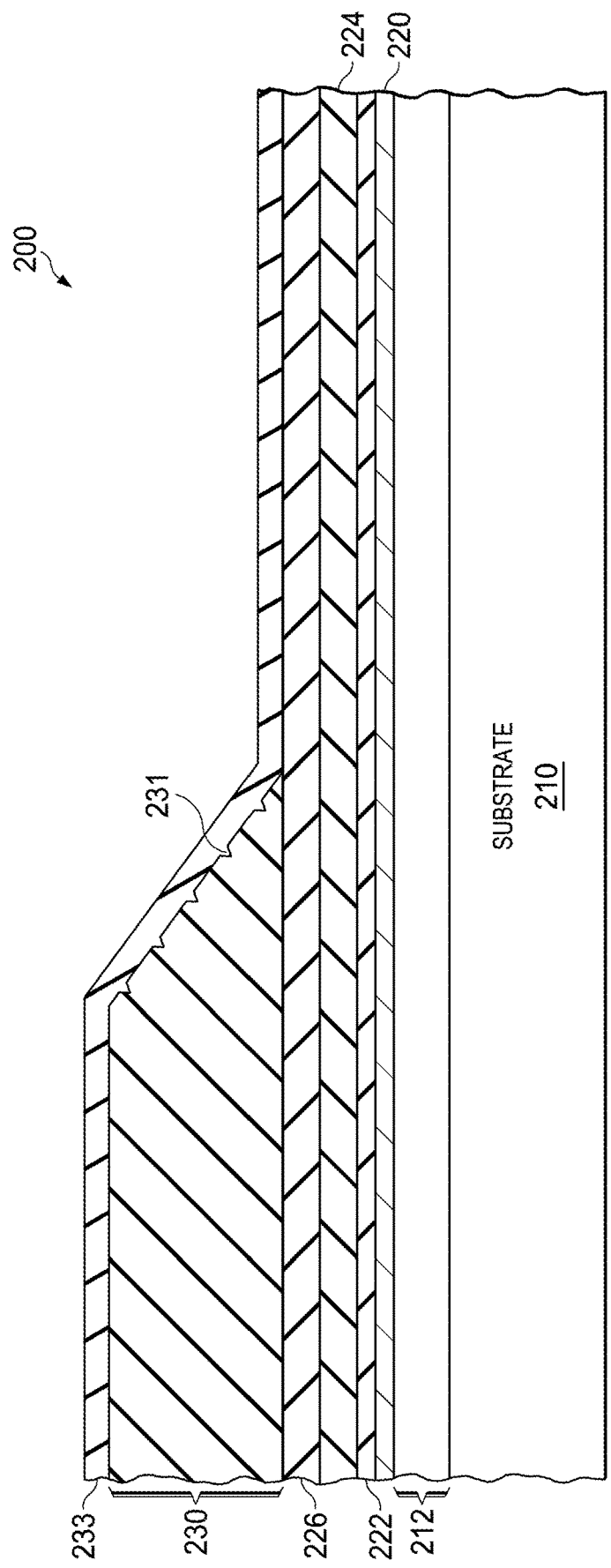
FIGS. 2B-2C depict cross-sectional views of the portion shown in FIG. 2A in subsequent stages of smoothing the sloped edge transition region.

Referring to FIGS. 1 and 2B concurrently, step 102 comprises depositing a dielectric layer 233 for at least partially filling the pits 231 to smooth a surface of the sloped dielectric sidewall portion of the mesa TEOS layer 230 that has topography. For example, silicon oxide can be deposited to a thickness, such as at least 0.2 µm, that is typically at least as large as the height (e.g., Mean Roughness (Roughness Average Ra)) of the topography on the sloped dielectric sidewall to be "smoothed", typically about 0.3 µm to 0.5 µm. The dielectric layer 233 can comprise SACVD or HDP to provide a material having essentially the same dielectric constant into the pits as the dielectric constant of the underlying silicon compound dielectric material sidewall.

HDP and SACVD are both recognized to be well suited to fill pits in the sloped dielectric sidewall as they provide excellent gap filling into high aspect ratio features. SACVD is known to have faster growth rate into crevices compared to on flat surfaces, so that both can be used as example deposition processes for disclosed sidewall smoothing. HDP also has the helpful feature of besides filling pits trimming (removing) the surface protrusions. The deposited silicon compound dielectric material at least partially fills the pits in the sloped dielectric sidewalls to reduce the surface roughness. See the atomic force microscopy (AFM) data described in the Examples section below.

Figure 2C:
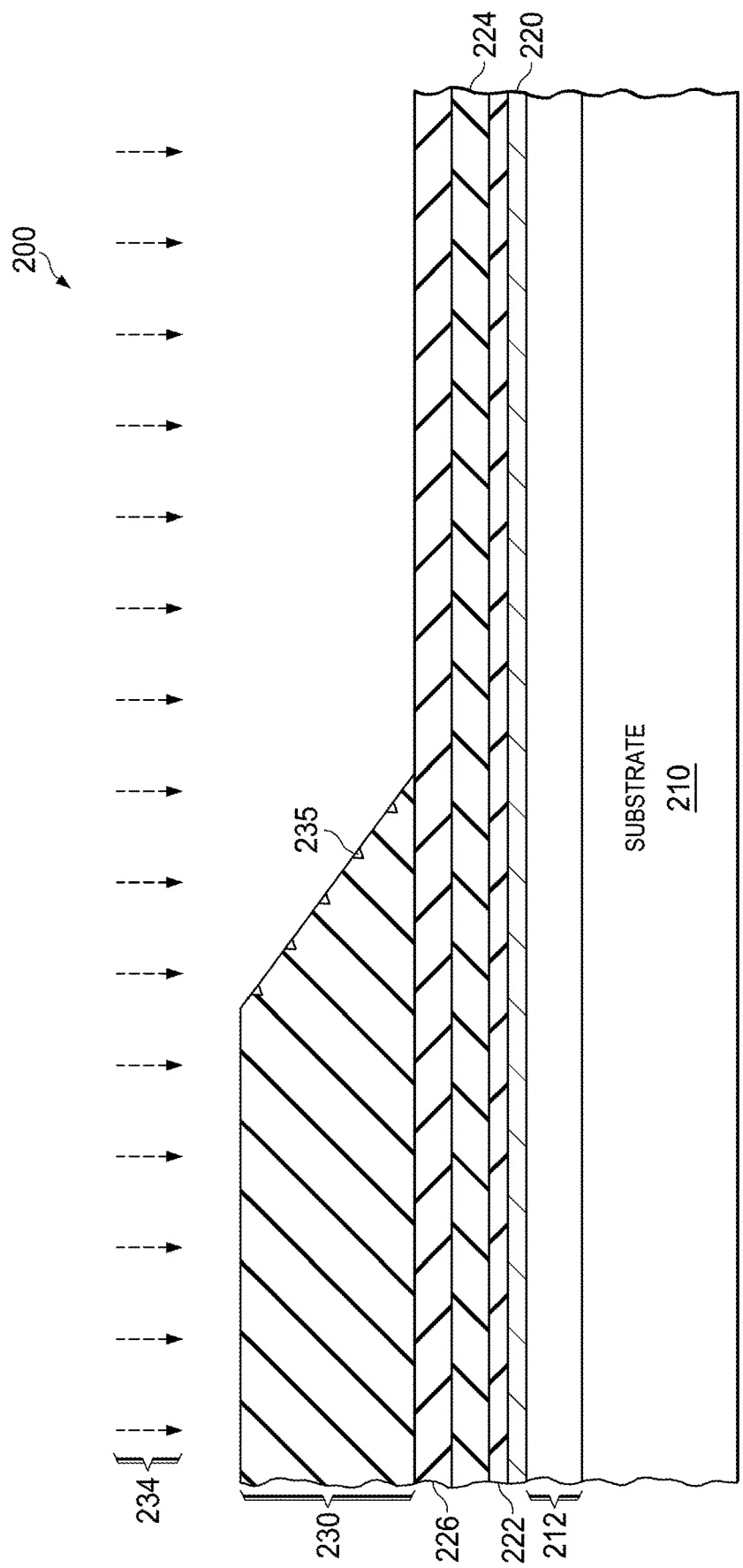

Referring to FIGS. 1 and 2C concurrently, step 103 comprises etching the dielectric layer 233 by an etch process 234. The etch process 234 is generally a blanket etching process. The deposited dielectric layer is then blanket etched, such as by a dry etch which can comprise $C_4F_8+O_2$ plasma etching. After this etching step, the dielectric layer is a discontinuous layer that has regions 235 located within former sidewall pits (or pores) 231.

Figure 3:
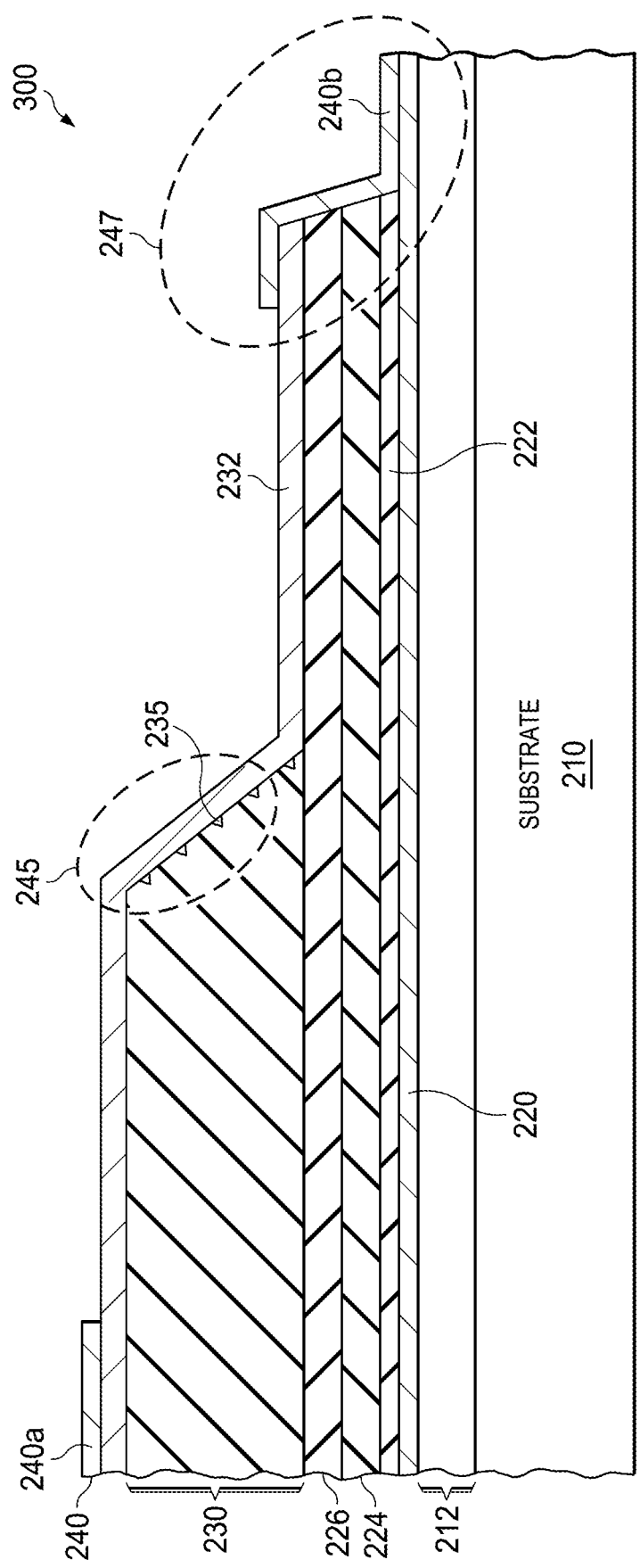
FIG. 3 depicts in a further cross-sectional view a portion of a high voltage or an extra-high voltage capacitor utilizing the mesa formation arrangement in FIG. 2A after dielectric sidewall roughness reduction and the formation of the top plate.

Step 104 comprises forming a top plate on a top of the dielectric feature. FIG. 3 depicts in another cross sectional view 300 a high voltage or extra-high voltage capacitor utilizing disclosed mesa formation at a subsequent processing step. FIG. 3 illustrates the results after depositing and patterning the top metal layer shown as including a top plate portion 240a deposited over the full thickness portion including all of the primary mesa TEOS layer 230 and a bottom plate bond pad portion 240b on the bottom plate 220. At this stage of the processing shown in FIG. 3, an optional dielectric layer 232 shown can be applied before depositing and patterning the top metal layer in a thickness in the range of about 800 nm to 1300 nm.

The dielectric layer 232 is directly over the primary mesa TEOS layer 230 and is for improving performance of the mesa capacitor structure. This dielectric layer 232 and the methods for forming this dielectric layer are described in a co-owned U.S. Pat. No. 9,299,697 which is hereby incorporated in its entirety by reference herein.

Dielectric layer 232 can be formed from at least a pair of sub-layers, the first sub-layer formed on the primary mesa TEOS layer 230 can be a SiON layer, and a second sub-layer formed on the capacitor dielectric can be a silicon nitride layer. As is shown below, dielectric layer 232 can be patterned after deposition as described in the above-referenced patent application to form an opening spaced laterally from the top plate portion 240a, thereby reducing leakage current and also reduces an electric field at the corners of the top plate portion 240a. The dielectric layer 232 conforms to the upper surface of the primary mesa TEOS layer 230 and generally has the same sloped shape in sloped edge transition region 245 as the primary mesa TEOS layer 230. After dielectric layer 232 is formed, which if it includes both the layers described above can be described as being a "bi-layer" dielectric, an etch step can be performed to create bond pad openings in the dielectric layers at areas away from the primary mesa TEOS layer 230, such as in region 247 shown in FIG. 3.

In one particular embodiment the dielectric layer 232 comprises silicon nitride (SiN) as the top layer being about 2 kA to 6 kA thick, SiON directly under the SiN layer being about 100 nm to 600 nm thick, then a relatively thick silicon oxide layer (e.g., up to 15 μm) referred to as mesa TEOS layer 230 extending down to an embedded ESL 226, such as a SiON layer which can be 50 nm-300 nm thick, which is itself over a silicon oxide layer (e.g., up to 1 μm) 224 on the bottom plate 220 of the capacitor.

The bond pad opening in region 247 contacting the bottom plate 220 is shown in FIG. 3. The top plate metal can comprise an aluminum cap layer that is sputtered on the wafer or substrate, for example. Following the formation of the dielectric layer 232, the top metal layer can be applied to the wafer to a thickness approximately between 700 nm to 1200 nm.

The top plate metal layer can be, in one example method, sputtered on the wafer, patterned and then etched to leave the top capacitor contacts. The top plate metal layer is generally comprised of at least two metal layers, a refractory metal barrier layer such as TiN, TiW, or TaN, and then an aluminum, aluminum-copper alloy, or a copper layer and the overlying metal is typically either a sputtered Al alloy such as Al-0.5 at % Cu or electroplated Cu. Because the edge of the primary mesa TEOS layer 230 was sloped in the prior etch as described above, as shown in sloped edge transition region 245, and especially for the case of metal removal by ME anisotropic etch processing, given disclosed pore filling, the subsequent etch is able to effectively clear the sloped area of the top metal layer, thus not leaving any top metal fragments that might otherwise concentrate the electric field within the capacitor, possibly leading to premature voltage breakdown.

A bond pad (not shown in these figures for simplicity) that typically comprises a metal including copper, gold, nickel and alloys of these, is then formed to provide a terminal for the top plate portion 240a and for the bottom plate bond pad portion 240b. After the top metal layer is formed, it is patterned to separate the top plate portion 240a from the bottom plate bond pad portion 240b. Bond wires or other connectors can then be attached to enable connection to the respective capacitor plates.

Alternatives include making connections to other components in the package or on the integrated circuit. In an arrangement, the top plate provided by the top plate portion 240a is a high voltage terminal and is coupled by a bond pad and ball bond connector to an external circuit, while the bottom plate 220 via its bottom plate bond pad portion 240b can be coupled to low voltage circuitry that can be, in one example arrangement, disposed on the same substrate 210 to form an integrated circuit. In other arrangements, the bottom plate 220 and bottom plate bond pad portion 240b can also be coupled to other circuitry using another ball bond connection.

Figure 4:
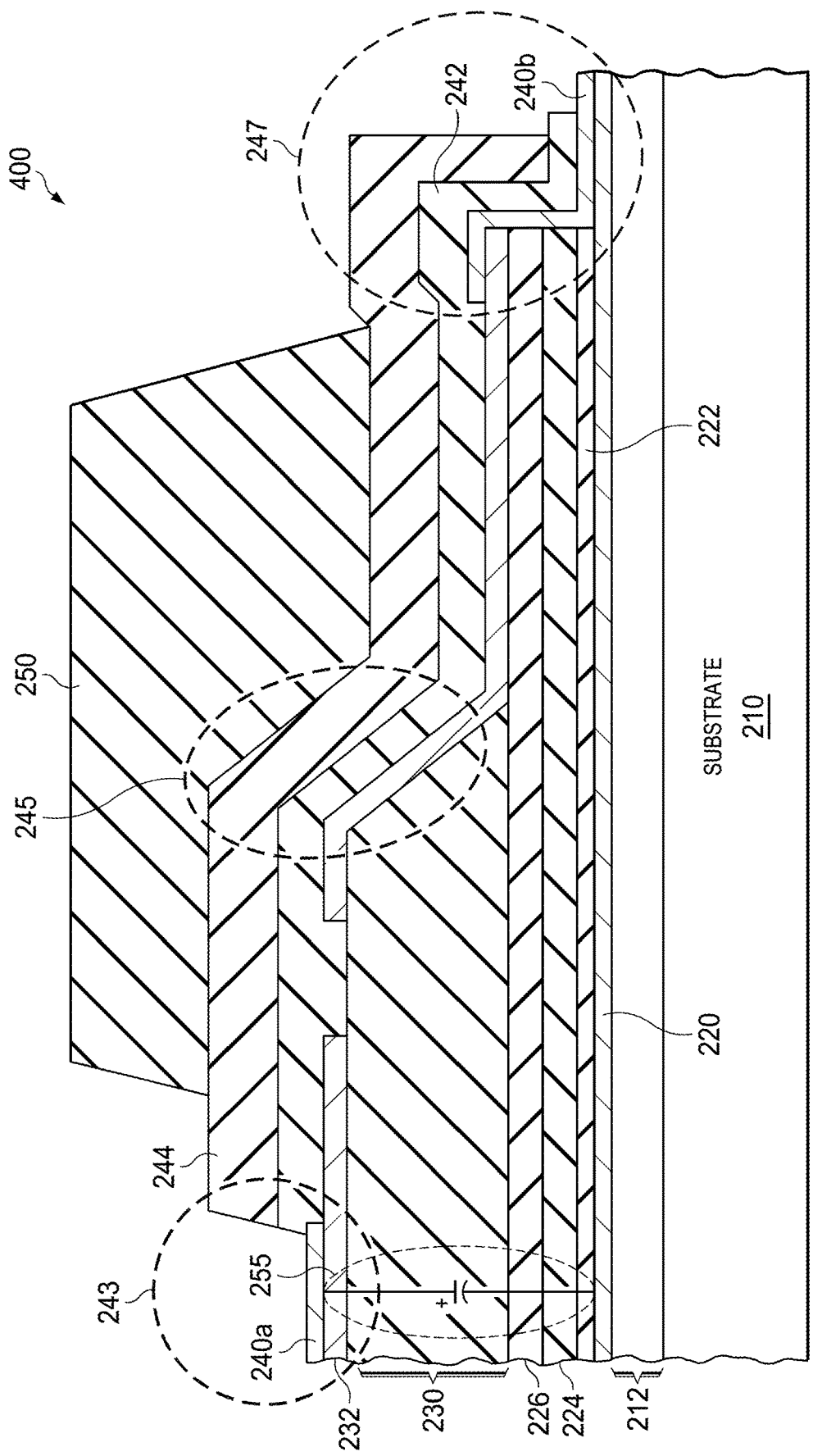
FIG. 4 depicts in another cross-sectional view a completed high voltage or extra-high voltage capacitor utilizing disclosed mesa formation and dielectric sidewall roughness reduction.

FIG. 4 depicts in another a cross sectional view 400 of a completed high voltage or extra-high voltage capacitor arrangement utilizing disclosed mesa formation and sloped sidewall pore filling. In an example arrangement, the patterned top metal layer comprising the top plate portion 240a and bottom plate bond pad portion 240b is a bilayer sputtered film including TaN and Al0.5% Cu layer. The top plate portion 240a is shown exposed in region 243, the 1st passivation overcoat (PO) layer 242, the 2nd PO layer 244 and the top polyimide (PI) layer 250, and the bottom plate bond pad portion 240b in shown exposed in region 247.

Completed disclosed high voltage or extra-high voltage integrated capacitors have unique features that result from the disclosed discontinuous dielectric layer that fills pores in the sloped sidewall portion of the capacitor. One such feature is the discontinuous dielectric layer having an interface with the sloped dielectric sidewall portion that may be evidenced by a scanning electron microscope (SEM) after exposure to a slight HF etch (e.g., a 10 sec dilute HF etch, such as using 10:1). A reactive ion etching (RIE) stain etch can also be used to image the different dielectric layers in a cross section view.

In FIG. 4, the capacitor symbol 255 illustrates where the capacitor is formed with the bottom plate 220 serving as the first terminal and the top plate portion 240a serving as the second terminal. The primary mesa TEOS layer 230 thickness is clearly the dominating dielectric thickness dimension for separating the capacitor plates, providing along with dielectric layer 232, the ESL layer 226, the initial mesa oxide layer 224 and metal barrier layer 222. The capacitor's dielectric thickness "d" in turn predicts the capacitor's breakdown voltage.

Figure 5:
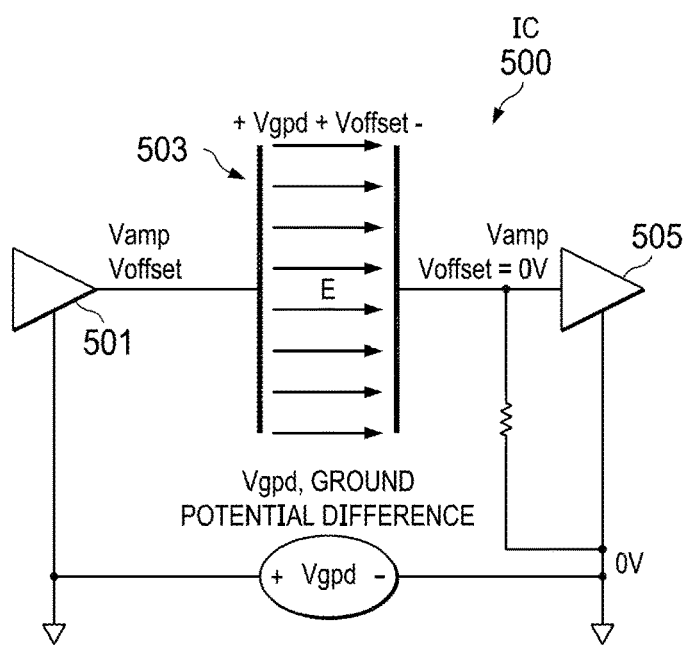
FIG. 5 depicts in a block diagram an example application for isolation using an isolation capacitor in a circuit arrangement.

FIG. 5 depicts in a block diagram an example application for electrical isolation using a disclosed integrated capacitor in an IC 500. In FIG. 5, a transmitter amplifier 501 is shown coupled to one plate of a disclosed isolation capacitor 503. A receiver amplifier 505 is shown coupled to the other plate of the isolation capacitor 503. The two amplifiers 501 and 505 are remote from one another and on different ground potentials such that a ground potential difference, shown as voltage Vgpd, exists. By using the isolation capacitor 503, the two grounds are not tied together but remain isolated from one another. There is thus no direct current (DC) path between the two amplifiers 501 and 505 and signals from the transmitter amplifier 501 can be received at the receiver amplifier 505 reliably as a result.

Figure 6:
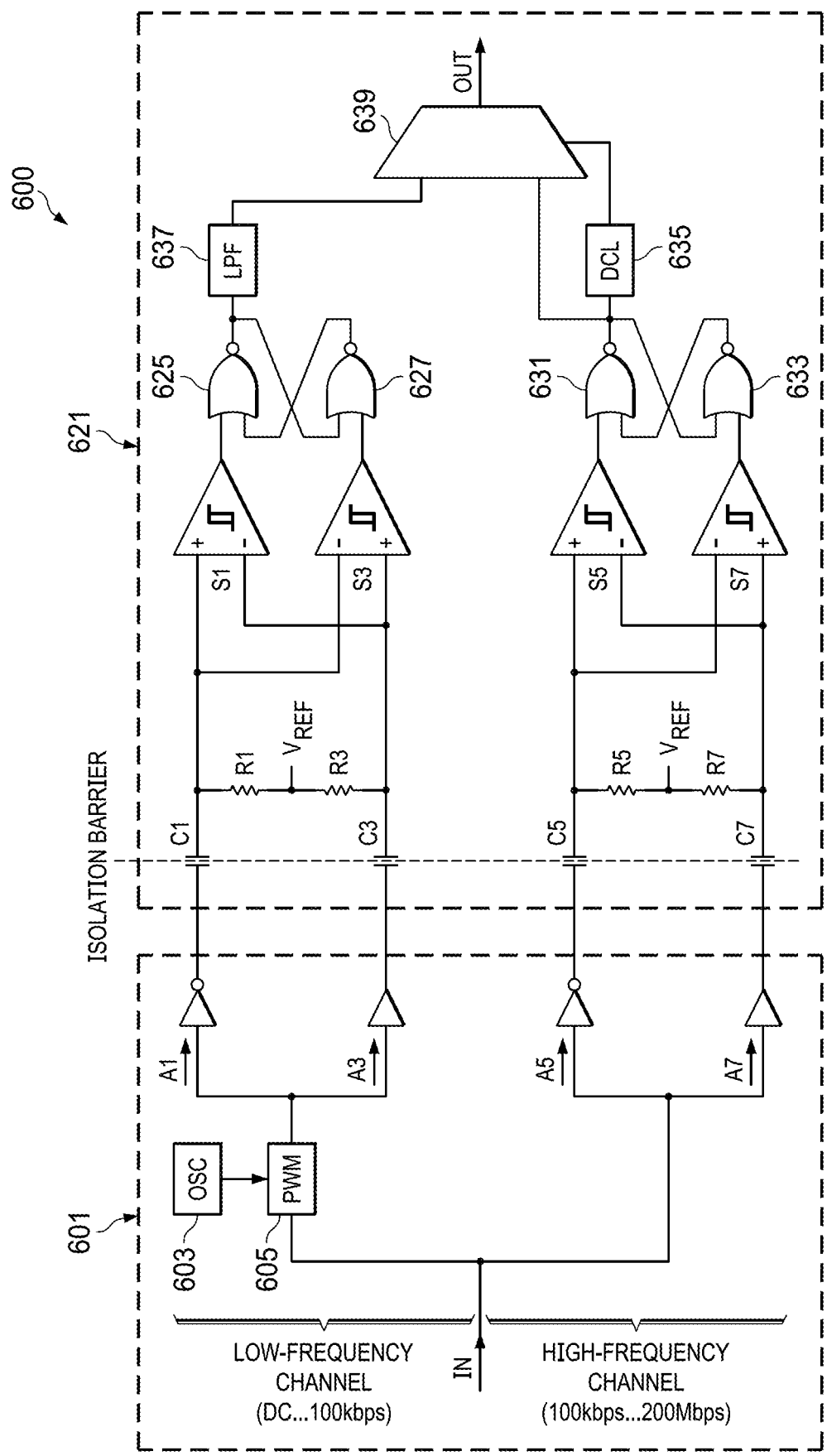
FIG. 6 depicts in a circuit diagram an application for disclosed isolation capacitors.

FIG. 6 depicts in a circuit diagram an application 600 for disclosed isolation capacitors. In FIG. 6, a transmitter circuit 601 that is in a first power domain is shown transmitting signals to a receiver circuit 621. In FIG. 6, the transmitter circuit 601 has both low-frequency and high frequency channels. The low frequency channel is sampled using an oscillator 603 to provide a clock to a pulse width modulation function 605. The data samples are output to an inverting amplifier A1 and a non-inverting amplifier A3 to provide a differential signal as an output. In a parallel path, high frequency signals are input to an inverting amplifier A5 and a non-inverting amplifier A7 to provide a second differential output signal. The receiver circuit 621 has a separate power and ground domain so that there would be a differential voltage between ground potentials, for example.

At the inputs of receiver circuit 621, capacitors C1, C3, C5 and C7 are coupled to isolate the input signals from the remainder of the receiver circuit 621 and to provide an isolation barrier. Offset voltages are compensated using a reference voltage Vref and resistors R1, R3, and R5, R7. The input signals from the capacitors C1, C3, C5, C7 are then input to pairs of Schmitt trigger amplifiers with hysteresis to provide glitch prevention noise reduction, and then latched by logic gate 625, 627 (low frequency signals) and gates 631, 633 (high frequency signals). The outputs of the low frequency path are low pass filtered at LPF 637, and input to an output multiplexer 639. The outputs of the high frequency path are input to a decision block DCL 635 and to the other input of the output multiplexer 639. The receiver circuit 621 can output either high frequency or low frequency signals at the OUT terminal.

The high voltage or extra-high voltage capacitors of the arrangements are used to provide the isolation capacitors C1, C3, C5 and C7 so that the two circuits are galvanically isolated. The receiver circuit 621 and the transmitter circuit 601 can be separate circuits, separate circuit boards, separate integrated circuits or remote portions of a circuit board or integrated circuit. The capacitors C1, C3, C5, and C7 can be integrated with the remaining components in receiver circuit 621 for example, or provided as discrete components or as a module or analog integrated circuit.

Figure 7:
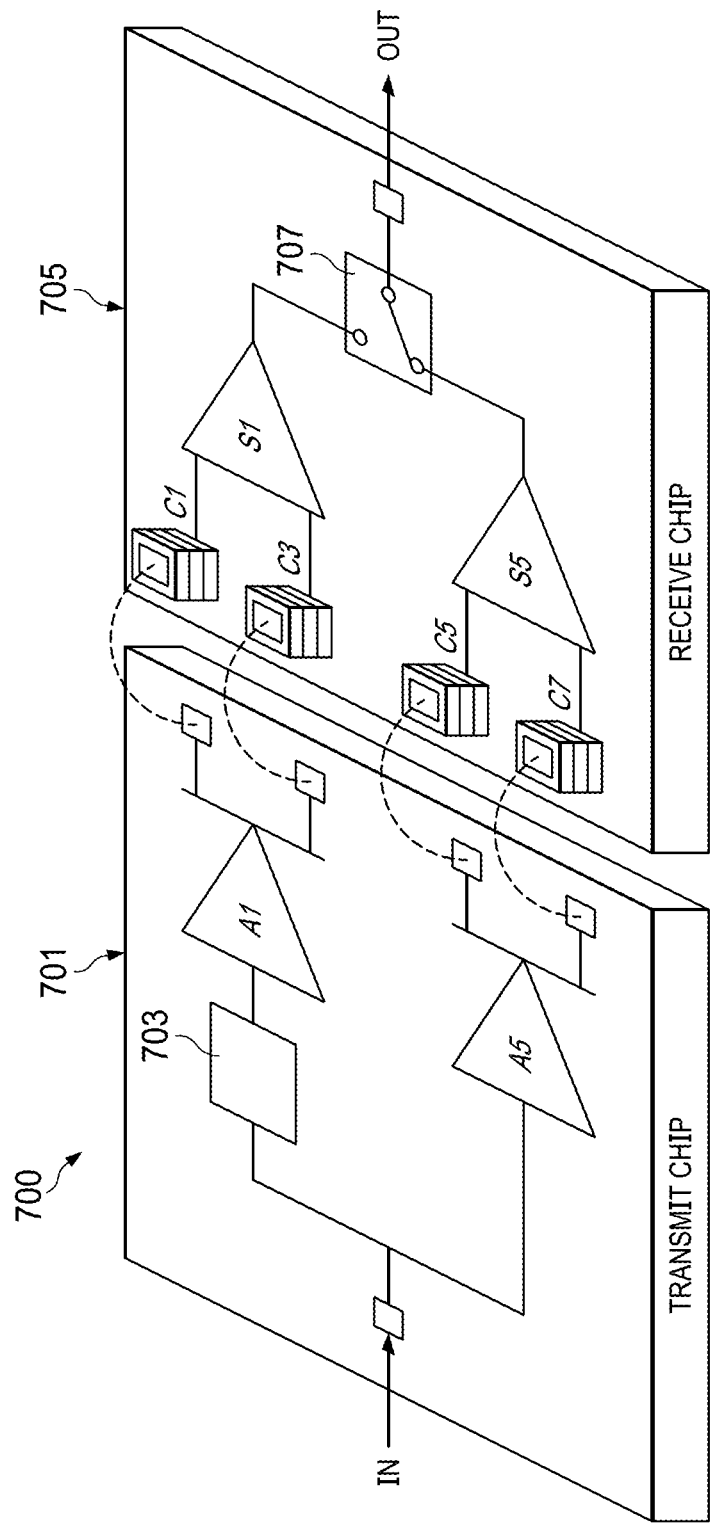
FIG. 7 depicts in a block diagram an example arrangement incorporating disclosed isolation capacitors.

FIG. 7 depicts in a block diagram an example arrangement 700 that incorporates disclosed isolation capacitors. In FIG. 7, a transmitter circuit 701 (shown as a transmit chip) is coupled to a receiver circuit 705 (shown as a receive chip). As shown in FIG. 7, the transmitter circuit 701 and receiver circuit 705 can be individual integrated circuit dies. In a non-limiting example arrangement, these two integrated circuits can be coupled by bond wires, balls such as ball grid array (BGA) balls, bumps, solder columns, or the like. In one non-limiting example the transmitter circuit 701 and receiver circuit 705 can be IC dies disposed in a single package. In additional alternative arrangements, the transmitter circuit 701 and receiver circuit 705 can be provided in separate packages.

In the example arrangement depicted in FIG. 7, the transmitter circuit 701 is shown including an oscillator 703 and amplifiers A1, A5 which are differential signal amplifiers in this non-limiting example, with wire bond connections coupling the output of amplifiers A1, A5 to the top plates of the capacitors C1, C3, C5, and C7 that are disposed on the receiver circuit 705. The example in FIG. 7 shows wire connections, e.g. bond wires, between the two devices, however other connections such as solder balls, solder columns, solder bumps, micro-BGA or BGA balls and the like, can be used to connect the two devices.

Because the transmit circuit is coupled to the top plate of the capacitors on the receiver circuit 705, and the capacitors C1, C3, C5, C7 are the high voltage or extra high voltage capacitors of the arrangements as described above, the two circuits are galvanically isolated one from another. The receiver amplifiers S1, S5 are coupled to the low voltage portions of the capacitors C1, C3, C5, C7, that is, by coupling to the bottom plates. The receiver circuit 705 shows differential inputs to a first amplifier S1 and a second amplifier S2, one for the low frequency channel, for example, and one for the high frequency channel, and a selector 707 selects the channel for transmitting as an output.

EXAMPLES

Disclosed embodiments are further illustrated by the following specific Examples, which should not be construed as limiting the scope or content of this Disclosure in any way.

Integrated capacitors were formed on a silicon wafer using a dry etch with $C_4F_8$ and $O_2$ etch gas applied to an 11.7 μm thick mesa stack primarily comprising silicon oxide (dielectric layer 232 comprising 0.5 μm silicon oxide layer on a 0.3 μm SiON layer and the primary 10.9 μm silicon oxide) to form about a 20-degree dielectric sidewall slope. AFM data was collected for the baseline (BL) process that did not include any disclosed sloped sidewall smoothing. Rq stands for Root Mean Square (RMS) roughness and Ra stands for mean roughness.

Two example embodiments were evaluated for reducing the roughness in the dielectric sidewall that were found to reduce the surface roughness of the sloped sidewall by as much as 70%. In one experiment, after the sloped oxide etch, for disclosed sidewall surface smoothing a ~400 nm HDP silicon oxide was deposited, and then a blanket etch back was used that etched about 400 nm of silicon oxide. The HDP deposition process comprised a Temperature of 300° C. to 375° C., silane and $O_2$ gases, and an etch/deposition ratio of 0.27 to 0.38.

In another experiment, after the sloped oxide etch, about 0.5 μm of SACVD silicon oxide was deposited, and was then blanket etched to etch about 0.5 μm of silicon oxide. The SACVD depositing comprised a Temperature of 600° C. to 660° C., a Pressure 600 to 700 Torr, and used TEOS and ozone gases.

The AFM roughness results for the BL process, and for the disclosed HDP process and SACVD process are all shown in the Table below:

|  | Image Rq (nm) | Image Ra (nm) |
| --- | --- | --- |
| BL | 257.00 | 186.50 |
| 400 nm HDP | 91.40 | 73.20 |
| 500 nm SACVD | 73.30 | 58.80 |

Integrated capacitors with disclosed sloped sidewall smoothing being substantially smoother then the sloped sidewalls of BL capacitors without disclosed smoothing will inherently trap less top metal particles after the top metal etch process. Less residual metal on the capacitor's sloped sidewall will lead to reduced incidence of premature breakdown of the integrated capacitor at their intended HV operating conditions.

Disclosed embodiments can be used to form semiconductor die that may be discrete devices or part of integrated circuits integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated capacitor, comprising:
    a semiconductor surface on a substrate;
    a bottom plate above and electrically isolated from said semiconductor surface;
    a dielectric feature comprising at least one silicon compound material layer having a sloped dielectric sidewall portion on said bottom plate;
    a discontinuous dielectric layer, including noncontiguous dielectric portions, that at least partially fills pits on a surface of said sloped dielectric sidewall portion, said discontinuous dielectric layer having an interface with said sloped dielectric sidewall portion, and
    a top plate on a top of said dielectric feature.

2. The integrated capacitor of claim 1, wherein said dielectric feature is a stack of layers comprising primarily by thickness silicon oxide.

3. The integrated capacitor of claim 2, wherein said dielectric feature further comprises at least one other layer of dielectric material between said silicon compound material layer and said top plate that comprises at least one of silicon nitride and silicon oxynitride.

4. The integrated capacitor of claim 1, wherein said silicon compound material layer and said discontinuous dielectric layer comprise different materials.

5. The integrated capacitor of claim 4, wherein said silicon compound material layer comprises a first silicon oxide material and said discontinuous dielectric layer comprises a second silicon oxide material.

6. The integrated capacitor of claim 1, wherein said sloped dielectric sidewall portion is at an angle between 10 and 40 degrees relative to a top of said semiconductor surface.

7. The integrated capacitor of claim 1, wherein a thickness of said dielectric feature is from 5 μm to 30 μm thick.

8. The integrated capacitor of claim 1, wherein said integrated capacitor is part of an integrated circuit (IC) formed on said semiconductor surface.

9. The integrated capacitor of claim 8, wherein said IC includes a plurality of said integrated capacitors.

10. The integrated capacitor of claim 8, wherein said IC comprises at least one of a transmitter and a receiver.

11. An integrated capacitor, comprising:
    a top plate and a bottom plate over a substrate;
    a capacitor dielectric layer between the top and bottom plates, the capacitor dielectric layer having a sloped sidewall portion with a plurality of pits; and
    a plurality of noncontiguous dielectric portions, each dielectric portion at least partially filling a corresponding one of the pits in the sloped sidewall portion.

12. The integrated capacitor of claim 11, wherein the dielectric layer has a thickness of at least 0.2 μm.

13. The integrated capacitor of claim 11, wherein said noncontiguous dielectric portions comprise TEOS oxide.

14. The integrated capacitor of claim 11, wherein said noncontiguous dielectric portions comprise HDP oxide.

15. The integrated capacitor of claim 11, further comprising a conformal dielectric layer over the capacitor dielectric layer, the conformal dielectric layer covering each of the noncontiguous dielectric portions.

16. The integrated capacitor of claim 15, wherein said conformal dielectric layer comprises a silicon nitride sublayer and a silicon oxynitride sublayer.

17. The integrated capacitor of claim 11, wherein said sloped sidewall portion is at an angle between 10 and 40 degrees relative to a top surface of the substrate.

18. The integrated capacitor of claim 11, wherein said capacitor dielectric layer has a thickness within a range from about 5 μm to about 30 μm.

19. The integrated capacitor of claim 11, wherein said integrated capacitor is part of an integrated circuit formed on said substrate.

20. The integrated capacitor of claim 11, further comprising a bottom plate bond pad portion that contacts the bottom plate and is formed from a same metal layer as the top plate, the sloped sidewall portion between the bottom plate bond pad portion and the top plate.

21. An integrated circuit, comprising:
    a capacitor having top plate and a bottom plate over a semiconductor substrate;
    a capacitor dielectric layer between the top and bottom plates, the capacitor dielectric layer having a sloped sidewall portion with a plurality of pits; and
    a plurality of noncontiguous dielectric portions at least partially filling the plurality of pits in the sloped sidewall portion.

22. The integrated circuit of claim 21, further comprising a receiver circuit over the semiconductor substrate, the receiver circuit connected to a first terminal of the capacitor.

23. The integrated circuit of claim 22, wherein a second terminal of the capacitor is configured to receive an oscillating signal conveying data.

* * * * *